United States Patent
Horn (10) Patent No.: US 8,861,272 B1
(45) Date of Patent: *Oct. 14, 2014

(54) SYSTEM AND METHOD FOR DATA RECOVERY IN A SOLID STATE STORAGE DEVICE USING OPTIMAL REFERENCE VOLTAGE VALUES OF A RELATED STORAGE ELEMENT

(71) Applicant: Western Digital Technologies, Inc., Irvine, CA (US)

(72) Inventor: Robert L. Horn, Yorba Linda, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/935,221

(22) Filed: Jul. 3, 2013

Related U.S. Application Data (63) Continuation of application No. 13/110,662, filed on May 18, 2011, now Pat. No. 8,503,237.

(51) Int. Cl.
G11C 29/42 (2006.01)
(52) U.S. Cl.
CPC ................................. *G11C 29/42* (2013.01)
USPC ............ 365/185.09; 365/185.03; 365/185.12; 365/185.17; 365/185.2; 714/773; 714/763
(58) Field of Classification Search
USPC ............ 365/185.02, 185.03, 185.09, 185.12, 365/185.11, 185.17, 185.2; 714/773, 763, 714/746
See application file for complete search history.

(56) References Cited

U.S. PATENT DOCUMENTS

| | | | |
|---|---|---|---|
| 5,875,477 A | 2/1999 | Hasbun et al. | |
| 5,956,473 A | 9/1999 | Ma et al. | |
| 6,741,502 B1 | 5/2004 | Cernea | |
| 6,888,735 B2 | 5/2005 | Nishihara | |
| 7,411,820 B2 | 8/2008 | Mo et al. | |
| 7,633,798 B2 | 12/2009 | Sarin et al. | |
| 8,085,607 B2 * | 12/2011 | Park et al. | 365/189.15 |
| 8,270,221 B2 | 9/2012 | Lee | |
| 8,503,237 B1 | 8/2013 | Horn | |
| 8,638,602 B1 | 1/2014 | Horn | |

(Continued)

OTHER PUBLICATIONS

Notice of Allowance dated in U.S. Appl. No. 13/110,662, 16 pages.

*Primary Examiner* — Andrew Q Tran (57) ABSTRACT

Embodiments of solid-state storage system are provided herein include data recovery mechanism to recover data upon detection of a read error (e.g., an uncorrectable ECC error) in a storage element such as a page. In various embodiments, the system is configured to determine optimal reference voltage value(s) by evaluating the reference voltage value(s) of page(s) that are related to the page where the failure occurred. The related page(a) may include a page that is paired with the initial page where the failure occurred (e.g., the paired pages reside in a common memory cell), or a neighboring page that is physically near the page where the initial page, and/or a paired page of the neighboring page. In another embodiment, the system is configured to perform a time-limited search function to attempt to determine optimal reference voltage values through an iterative process that adjusts voltage values in a progression to determine a set of values that can retrieve the data.

33 Claims, 7 Drawing Sheets

(56) References Cited

U.S. PATENT DOCUMENTS

| | | |
|---|---|---|
| 2008/0244339 A1 | 10/2008 | Kong et al. |
| 2009/0024904 A1 | 1/2009 | Roohparvar et al. |
| 2009/0129153 A1 | 5/2009 | Sarin et al. |
| 2009/0282186 A1 | 11/2009 | Mokhlesi et al. |
| 2009/0287956 A1 | 11/2009 | Flynn et al. |
| 2009/0310406 A1 | 12/2009 | Sarin et al. |
| 2010/0017684 A1 | 1/2010 | Yang |
| 2010/0082919 A1 | 4/2010 | Chen et al. |
| 2010/0162084 A1 | 6/2010 | Coulson et al. |
| 2010/0162085 A1 | 6/2010 | Mati |
| 2010/0169743 A1 | 7/2010 | Vogan et al. |

\* cited by examiner

| State | Threshold 1 | Threshold 2 | Threshold 3 |
|---|---|---|---|
| 1 | -Step | -Step | -Step |
| 2 | -Step | -Step | +Step |
| 3 | -Step | -Step | Nominal |
| 4 | -Step | +Step | -Step |
| 5 | -Step | +Step | +Step |
| 6 | -Step | +Step | Nominal |
| 7 | -Step | Nominal | -Step |
| 8 | -Step | Nominal | +Step |
| 9 | -Step | Nominal | Nominal |
| 10 | +Step | -Step | -Step |
| 11 | +Step | -Step | +Step |
| 12 | +Step | -Step | Nominal |
| 13 | +Step | +Step | -Step |
| 14 | +Step | +Step | +Step |
| 15 | +Step | +Step | Nominal |
| 16 | +Step | Nominal | -Step |
| 17 | +Step | Nominal | +Step |
| 18 | +Step | Nominal | Nominal |
| 19 | Nominal | -Step | -Step |
| 20 | Nominal | -Step | +Step |
| 21 | Nominal | -Step | Nominal |
| 22 | Nominal | +Step | -Step |
| 23 | Nominal | +Step | +Step |
| 24 | Nominal | +Step | Nominal |
| 25 | Nominal | Nominal | -Step |
| 26 | Nominal | Nominal | +Step |

US 8,861,272 B1

SYSTEM AND METHOD FOR DATA RECOVERY IN A SOLID STATE STORAGE DEVICE USING OPTIMAL REFERENCE VOLTAGE VALUES OF A RELATED STORAGE ELEMENT

CROSS-REFERENCE TO RELATED APPLICATIONS

This application is a continuation of U.S. patent application Ser. No. 13/110,662, filed May 18, 2011, the disclosure of which is hereby incorporated by reference in its entirety.

BACKGROUND

1. Technical Field

This disclosure relates to non-volatile storage subsystems, including but not limited to flash drives. More particularly, the disclosure relates to systems and methods for an enhanced data recovery method for solid state storage devices.

2. Description of the Related Art

Flash memory devices store information in an array of memory cells constructed with floating gate transistors. In single-level cell (SLC) flash devices, each cell stores a single bit of information. In multi-level cell (MLC) devices, each cell stores two or more bits of information. When a read operation is performed, the electrical charge levels of the cells are compared to one or more voltage reference values (also called "voltage thresholds" or "threshold levels") to determine the state of each cell. In SLC devices, each cell is read using a single voltage reference value. In MLC devices, each cell is read using multiple voltage references values. Some flash devices implement commands for enabling an external memory controller to set the voltage reference values.

Various factors can contribute to data read errors in flash memory devices. These factors include charge loss or leakage over time, and device wear caused by usage. When the number of bit errors on a read operation exceeds the ECC (error correction code) correction's capability of the storage subsystem, the read operation fails.

BRIEF DESCRIPTION OF THE DRAWINGS

Systems and methods that embody the various features of the invention will now be described with reference to the following drawings, in which.

DETAILED DESCRIPTION

While certain embodiments of the inventions are described, these embodiments are presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions.

Overview

Embodiments of solid-state storage system are provided herein include data recovery mechanism to recover data upon detection of a read error (e.g., an uncorrectable ECC error) in a storage element such as a page. Although "page" and "pages" are used throughout this disclosure, those skilled in art would appreciate that various embodiments are applicable to other units of storage such as sectors, blocks, etc. In various embodiments, the system is configured to determine optimal reference voltage value(s) by evaluating the reference voltage value(s) of page(s) that are related to the page where the failure occurred. The related page(a) may include a page that is paired with the initial page where the failure occurred (e.g., the paired pages reside in a common memory cell), or a neighboring page that is physically near the page where the initial page, and/or a paired page of the neighboring page. In another embodiment, the system is configured to perform a time-limited search function to attempt to determine optimal reference voltage values through an iterative process that adjusts voltage values in a progression to determine a set of values that can retrieve the data.

System Overview

Figure 1:
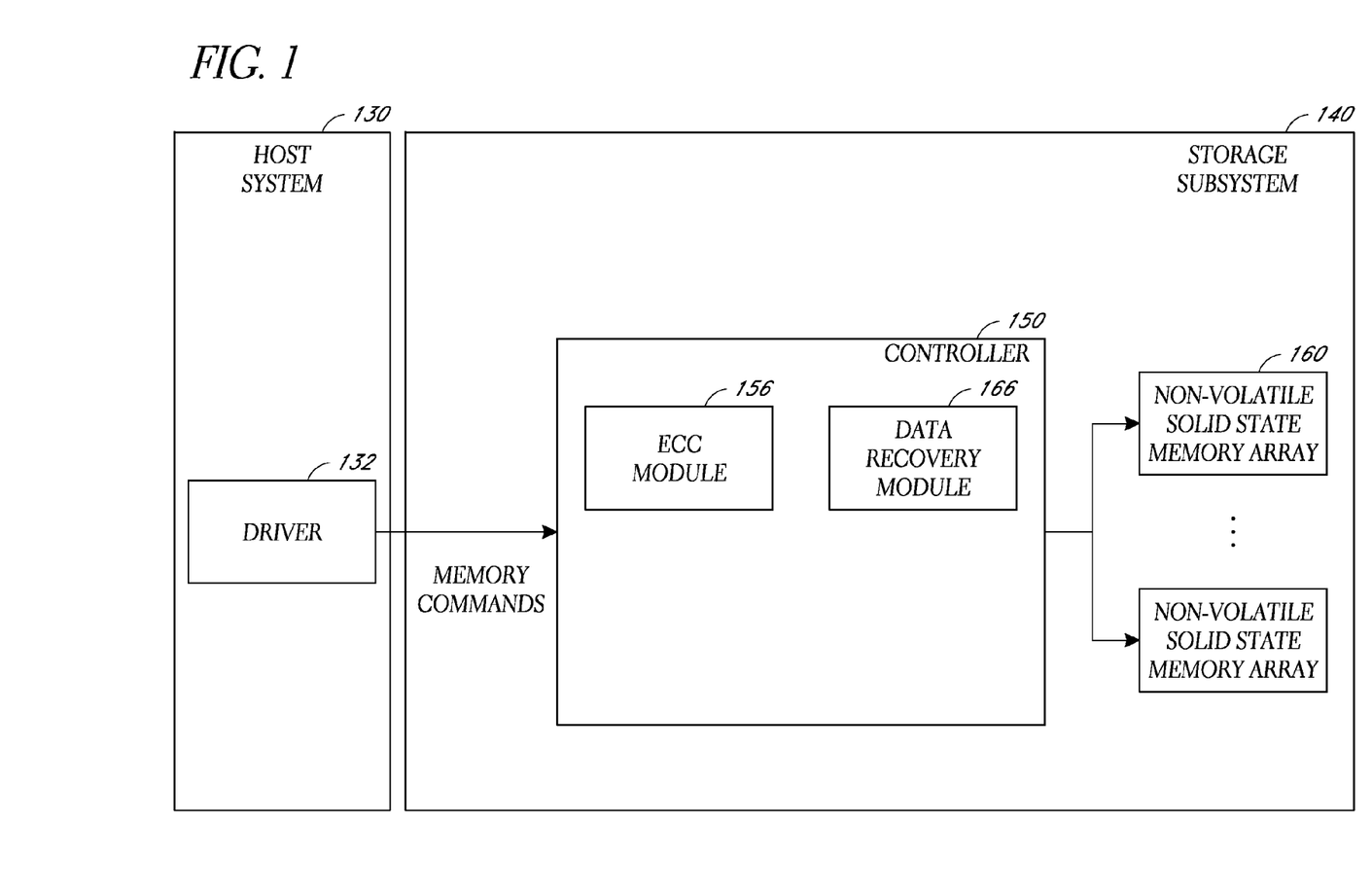
FIG. 1 is a block diagram illustrating a storage device that implements a data recovery scheme according to one embodiment of the invention.

FIG. 1 is a block diagram illustrating a storage device implementing a data recovery scheme according to one embodiment. As shown, a storage subsystem/device 140 includes a controller 150 and one or more non-volatile solid-state memory arrays 160. The controller 150 in one embodiment in turn includes an ECC (error correction code) module 146 and a data recovery module 166. In other embodiments, the two modules may be separated into additional modules or combined into one module. In one embodiment, the data recovery module 166 is configured to execute the data recovery processes in the storage device as further described below. For example, the data recovery module 166 may initiate data recovery when the ECC module 146 indicates that it is unable to correct errors it counters in a read operation.

In one embodiment, the controller 150 of the storage device 140 is configured to receive and execute commands from a device driver 132 in a host system 130. The memory commands from the driver 132 may include write and read commands issued by the host system 130. As further shown in FIG. 1, in one embodiment, the controller 150 executes the received commands in one or more non-volatile solid-state memory arrays 160. The arrays may comprise, for example, flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), or other discrete NVM chips. The solid state storage devices may be physically divided into blocks, pages and sectors, as is known in the art. Other forms of storage (e.g., battery backed-up volatile DRAM or SRAM devices, magnetic disk drives, etc.) may additionally or alternatively be used.

The storage device 140 may implement an ATA command set and interface, although other command sets and interfaces may additionally or alternatively be used. In addition to serving commands coming from the host system 130, the controller 150 in one embodiment also services data access requests related to internally-initiated memory operations, such as accesses performed for garbage collection, wear-leveling, or coherency and/or redundancy checking.

Voltage Drift

Figure 2:
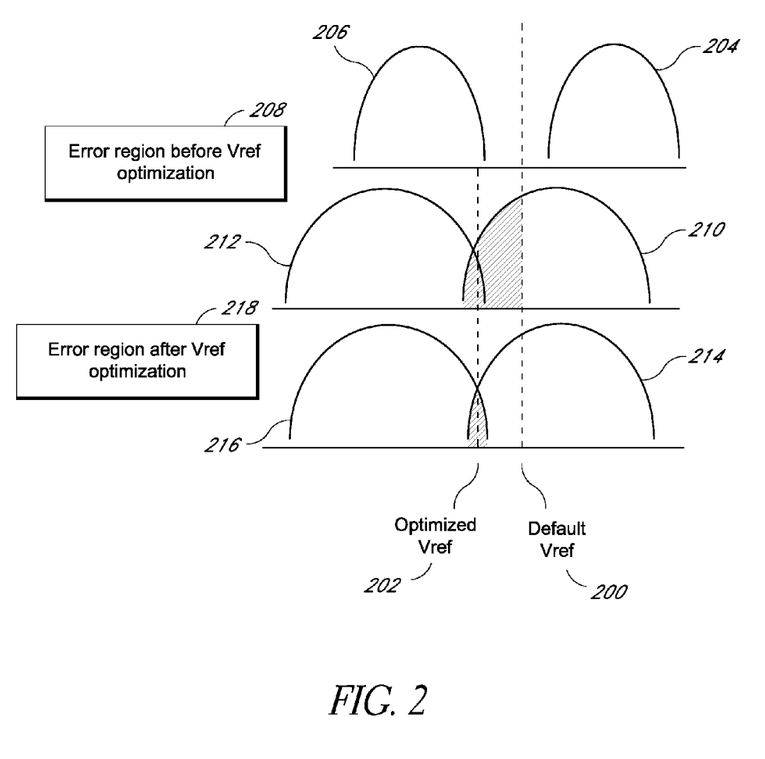
FIG. 2 includes several graphs that show the drifting of voltage in a distribution of memory cells in a storage device over time.

Various factors, including cell failure, program/erase wear, retention limits, read disturb, etc. can contribute to read errors on a flash memory device. The most common read failure is that the voltage stored in a NAND cell crosses the default threshold value that distinguishes it from a neighboring but distinct voltage. FIG. 2 includes several graphs that show the drifting of voltage distributions of memory cells in a storage device over time. The top most graph shows voltage distribution of memory cells of a recently programmed storage device before any of the deteriorating effects have taken place. Note that voltage distributions 204 and 206 can be easily separated by the use of a default reference voltage 200. In other words, the use of default reference voltage 200 with such distributions would not result in reading errors due to an inability to distinguish neighboring voltages. Ideally, a default reference voltage should be in the mid point of the difference separating two neighboring voltage distributions.

However, over time, some of the above described wear and tear factors result in drifts in the voltage distributions as shown in the distributions 210 and 212 in the middle graph. By now, the two distributions overlap, and cells in that overlap area would be in an error region 208. For those cells, the default reference voltage 200 can no longer be used to distinguish neighboring voltages without errors. Some of those errors may be correctable by ECC, but there will likely be instances where the number of errors may be beyond the ability of ECC to correct.

In the bottom graph, applying embodiments of the invention, an optimized voltage reference 202 is used. By using the optimized voltage reference 202, the error region 218, which represents the total number of bits in error, is much reduced. As a result, the total number of read errors is reduced so that the errors are more likely to be ECC correctable.

Error Recovery Process

Figure 3:
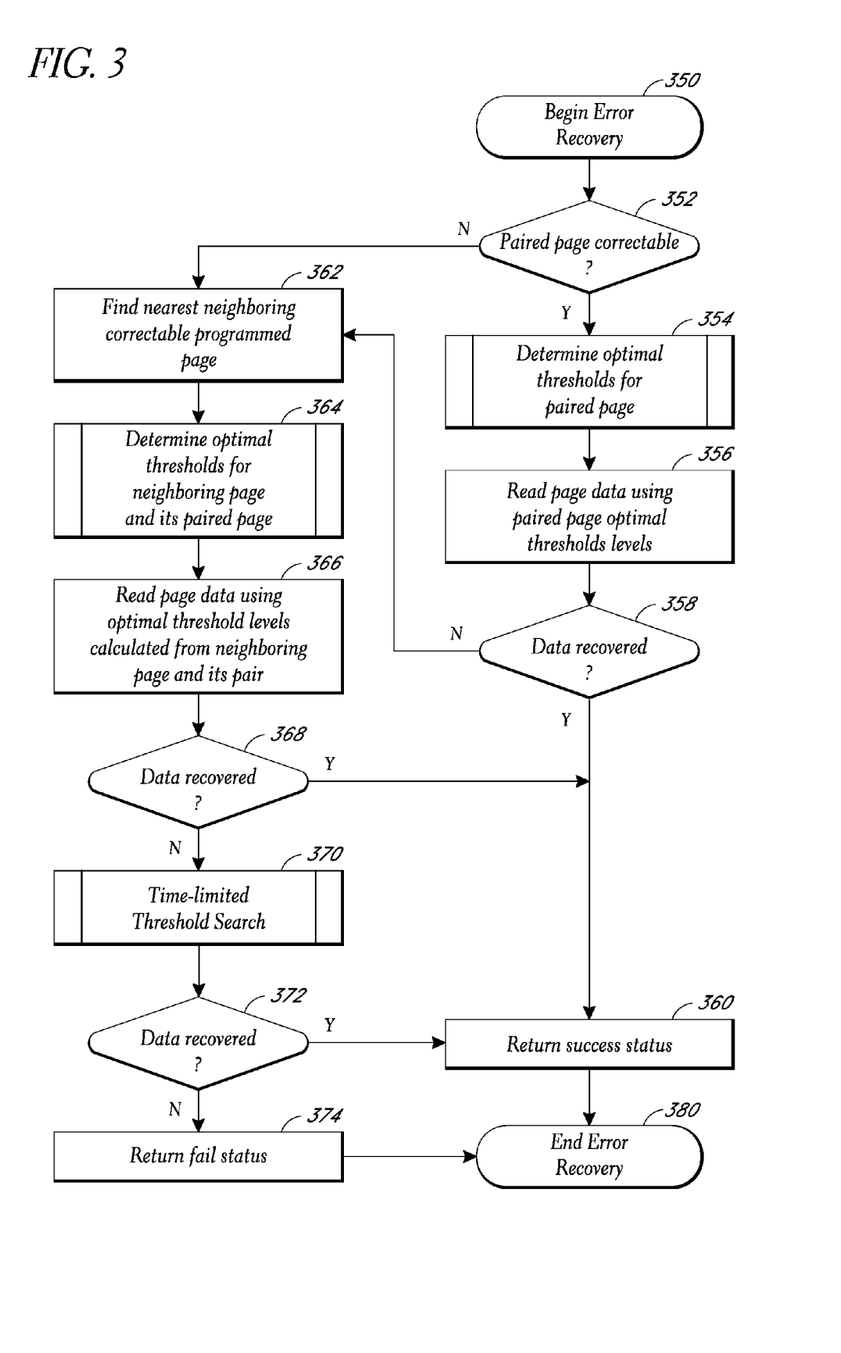
FIG. 3 is a flow diagram that illustrates the error recovery process according to one embodiment.

FIG. 3 is a flow diagram that illustrates the error recovery process 350 according to one embodiment. Generally, the process 350 attempts data recovery by using reference voltages of one or more pages related to the page where the read errors occurred and uses those voltages for data recovery. Process 350 in one embodiment may be triggered when the result of a read operation on a page is uncorrectable by ECC. In one embodiment, the process 350 may be executed by the data recovery module 166 and/or the controller 150. At block 352, the process determines whether the paired page of the page at which the read error occurred is correctable. In one embodiment, paired pages are pages that share the same memory cell in the storage device. In one embodiment, at block 352, the process in particular determines whether the paired page is programmed with data and whether the data is correctable. If so, the process at block 354 determines the optimal thresholds (threshold voltages) for the paired page, a process that is further illustrated in FIG. 4. Once the optimal thresholds are determined, the process attempts to read data from the page where the error occurred using the determined thresholds. If the data is recovered at block 358, a success status is returned at block 360 and the process terminates at block 380. Otherwise, the process moves on to attempt additional data recovery operations at block 362. The paired page is used here because it shares a common memory cell with the page in which the failure occurred. Because of the two pages share a common physical cell, this means that the paired page likely has the same voltage drift and usage profile (i.e., age of data) with the page in which the read error occurred, and reference voltages that work for the paired page in retrieving data are likely to work on the page in which the error occurred.

In one embodiment, the process may arrive at block 362 after a failure to recover data using the paired page thresholds (block 358) or if the pair page is not correctable (or not programmed) in the first place (block 352). In some embodiments, the data recovery process moves into block 362 directly and does not use the paired page to determine optimized thresholds. Regardless, at block 362, the process finds the nearest correctable programmed page (nearest in terms of physical distance in the storage device). In one embodiment, the page may be adjacent to the page where the read error occurred. The rationale for using of a nearby page is based on an observation that physically adjacent storage elements typically are written and read at the same time. Thus a nearby page likely contains data of the same age, and is likely to have suffered the same read disturb effect and/or the same amount of other wear and tear factors previously described above.

Figure 4:
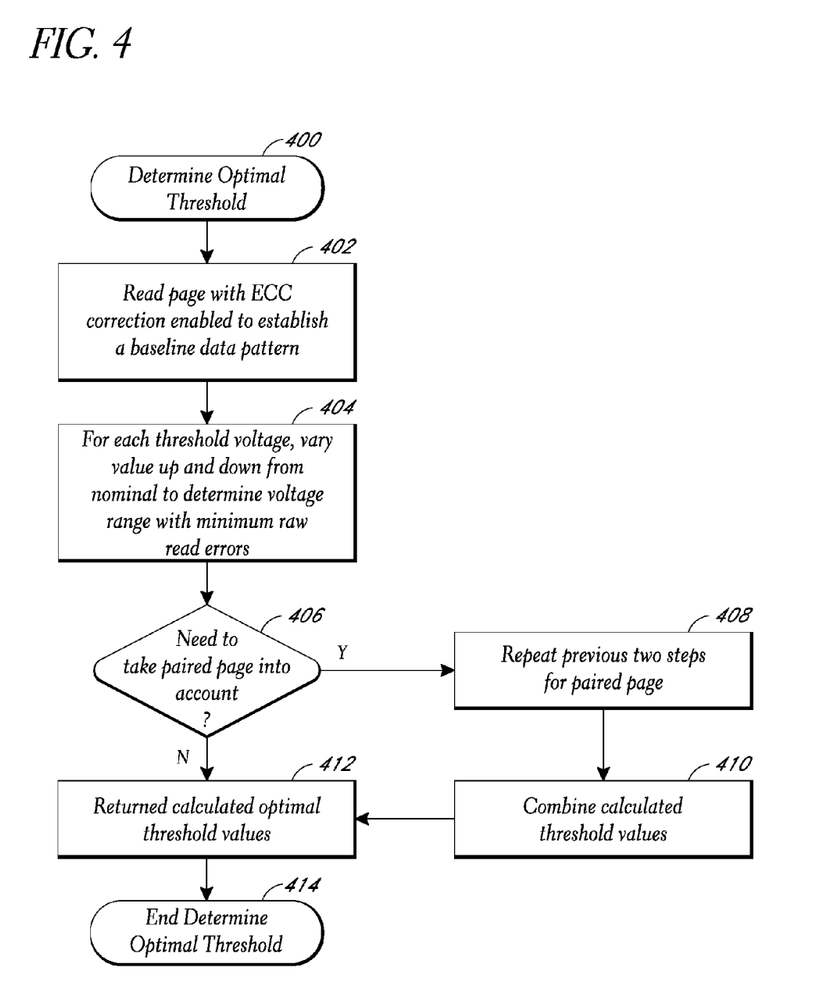
FIG. 4 is a flow diagram illustrating the optimal threshold determination process in accordance with various embodiments of the invention.

At block 364, the process in one embodiment determines optimal thresholds for the neighboring page and its paired page at block 364, a process that will be further illustrated in FIG. 4. In another embodiment, the optimal thresholds are determined using the neighboring page's thresholds only. Once the optimal thresholds have been determined in block 366, the process reads data from the page where the error occurred using the determined optimal thresholds from block 364. If the data recovery successful at block 368, a success status is returned at block 360. Otherwise, the process may attempt additional recovery attempt(s) using a time-limited search process at 370. The time-limited search process will be further described below in conjunction with FIG. 5. If the data is not recovered from the time-limited search process (block 372), the process returns a failure status at block 374. If the time-limited search process is successful, the process goes to block 360 and proceeds as described above.

Optimal Threshold Determination

FIG. 4 is a flow diagram illustrating the optimal threshold determination process in accordance with various embodiments of the invention. In one embodiment, the process 400 may be executed by the data recovery module 166 and/or the controller 150. In one embodiment, the process 400 is executed as part of the process 350 in blocks 354 and 364 to determine the optimal thresholds. The process 400 begins at block 402, where a page is read with ECC correction enabled to establish a baseline data pattern. The may involve reading first with ECC correction enabled to get the corrected data, and reading again without ECC to determine the raw read data, and comparing the results of the two reads to see how many bits were corrected by the ECC. Using the baseline data pattern from block 404, each threshold voltage is varied up or down from nominal to determine voltage range with minimum raw read errors. For example, a page may be initially read with three nominal voltage thresholds A, B, and C resulting in 27 bits of error. Then voltage threshold A may be adjusted upward and downward to determine a value that will lead to the minimum number of bits of error. For example, A may be initially adjusted upward to A1 leading to 23 bits of error, and then upward again to A2 leading to 21 bits of error, and then adjusted a third time to A3 leading to 25 bits of error. At that time, the next value to try may be adjusted downward since the number of bits of error has increased going from A2 to A3. An A4 value between A2 and A3 may be attempted. In this manner, A is adjusted until an optimal threshold value that leads to the minimum number of errors is found. The same process may be repeated then for thresholds B and C until a set voltage thresholds leading to a minimum number of read errors is found.

In block 406, the process determines whether the paired page needs to be processed as well. In one embodiment, this determination is based largely on which block in FIG. 3 triggered the process 400 of FIG. 4. If process 400 is triggered in block 354, then the process 400 is just tasked with determining the optimal thresholds of a paired page of the page where the initial read error occurred. In that case, the result of block 406 would be negative since only one page needs to be processed. The process 400 in that case would proceed to return calculated optimal threshold values at block 412 and terminate at block 414.

On the other hand, if the process 400 is triggered in block 364 of FIG. 3, then the optimal thresholds to be determined are based on both (1) a neighboring page of the page that triggered the initial error, and (2) the paired page of the neighboring page. In this instance, at block 406 the process proceeds to block 408, where it repeats the functions performed in blocks 404 and 406 for the paired page of the neighboring page. In block 410, the process calculates the threshold values by combining the threshold values from the neighboring page and the paired page of the neighboring page. In one embodiment, the combination is based on an average of the values. In another embodiment, the combination is based on a weighted average of the values, with more weight given to (1) values from the neighboring page, (2) values from the paired page of the neighboring page, or (3) values from the page that resulted in the least amount of ECC errors. After the combination, the process 400 proceeds to return calculated optimal threshold values at block 412 and terminate at block 414. As discussed above in FIG. 3, in some embodiments, the process 350 may simply use the values from the neighboring page. In that case, the process 400 may calculate the optimal threshold values by using the neighboring page's values only.

In one embodiment, the optimal threshold determination process 400 may be replaced and/or supplemented by looking up a value table that stores optimal values from the pages of the storage device. In one embodiment, the value table is updated with new values determined by the process 400 when it determines new values. In another embodiment, the optimal values in the table are periodically updated by a background process.

Time-Limited Search

Figure 5:
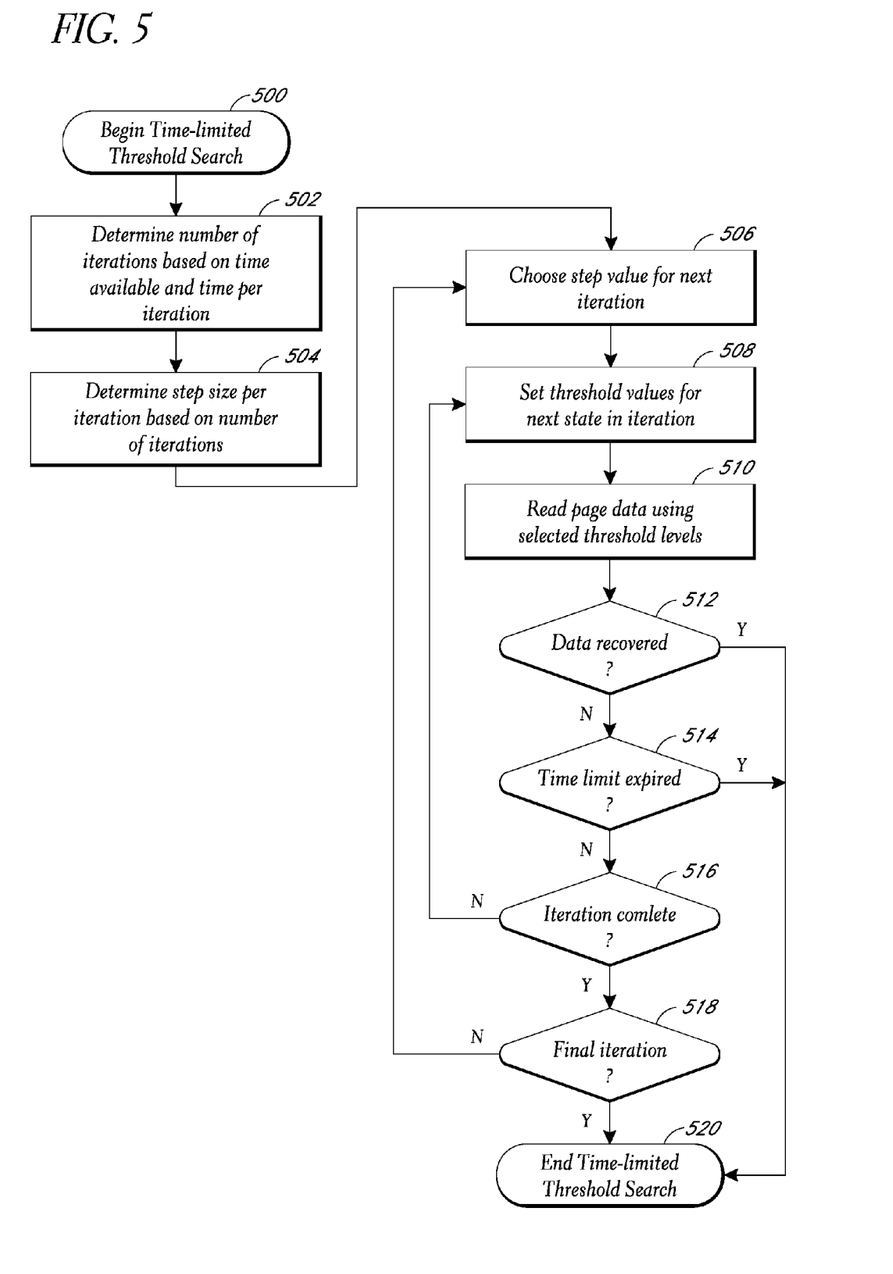
FIG. 5 is a flow diagram illustrating the time-limited search process according to one embodiment.
Figure 6A:
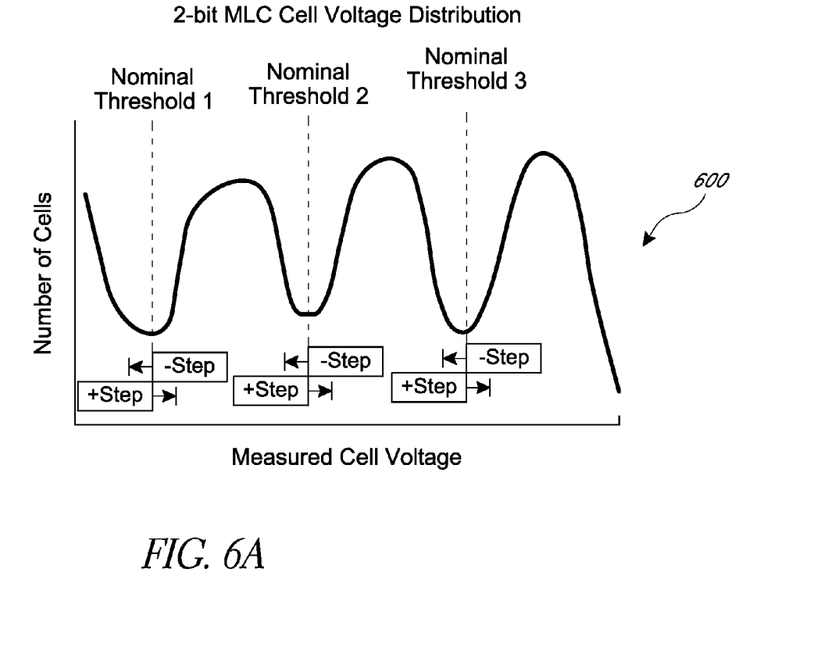
FIG. 6A is a graph that illustrates adjusting the threshold voltages by steps against a 2-bit MLC cell voltage distribution according to one embodiment.
Figure 6B:
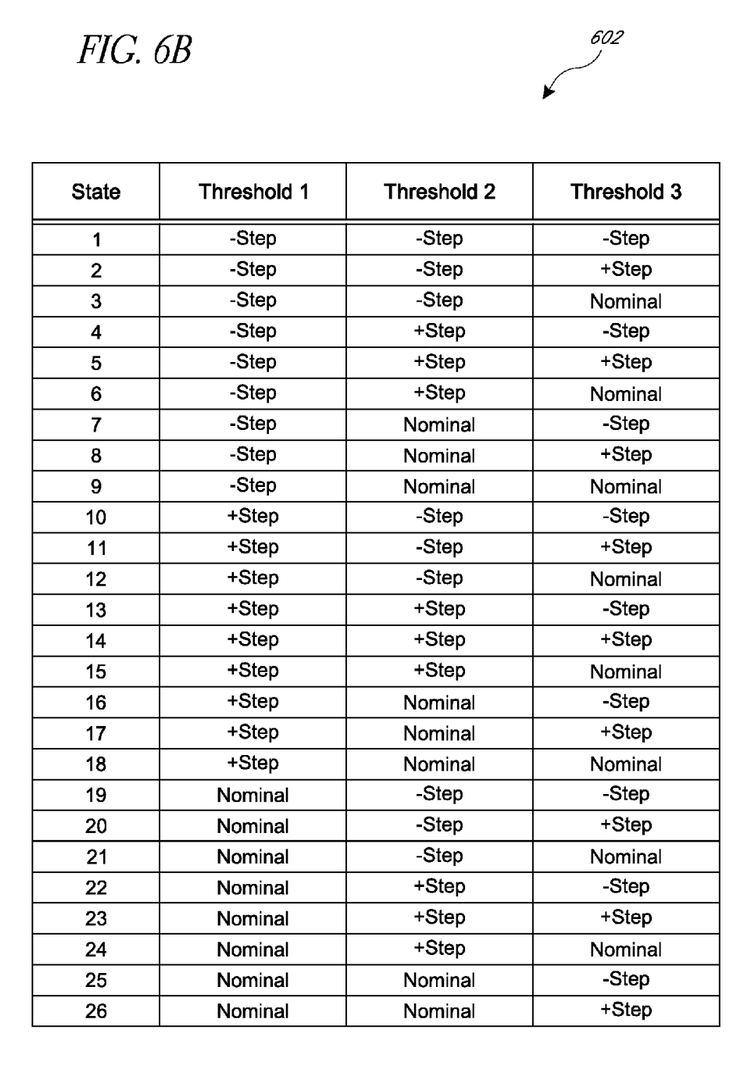
FIG. 6B illustrates a procession of adjustment steps in a time-limited search according to one embodiment.

FIG. 5 is a flow diagram illustrating a time-limited search process 500 according to one embodiment. In one embodiment, the process 500 may be executed by the data recovery module 166 and/or the controller 150. In one embodiment, the process is triggered at block 370 of FIG. 3. The process begins at block 502 where it determines a number of iterations based on time available to complete the entire process and time needed per iteration. In one embodiment, the time available is based on a deadline imposed by performance requirement to complete the read operation and return either the data or failure status to the requester of the read operation (e.g., a host). In block 504, the process determines the step size per iteration based on number of iterations. In one embodiment, each iteration uses a different step size. In block 506, the process chooses steps value for the next iteration. The process in block 508 then sets threshold values for next state in iteration, a process that will be further explained in FIGS. 6A and 6B. Then in block 510 the page data is read using selected threshold values. If the data is recovered in block 512, the process terminates at block 520. If not, then the process checks whether the time limit has been reached in block 514. If so, the process also terminates. If not, the process additionally checks whether the current iteration is complete at block 516. If the determination at block 516 is that the current iteration is not complete, the process returns to block 508 to set the next state in the iteration. If the current iteration is complete, the process next determines whether it has completed the final iteration at block 518. If so, the process terminates. If not, the process returns to block 506 to begin the next iteration, which may have a different step size and the process goes through the various states with the new step size FIG. 6A is a graph that illustrates adjusting the threshold voltages by steps against a 2-bit MLC cell voltage distribution according to one embodiment. FIG. 6B illustrates a procession of adjustment steps in a time-limited search according to one embodiment. The two figures together illustrate the time-limited search process shown in FIG. 5 (blocks 506-516). The three nominal thresholds 1, 2, and 3 are plotted against the distribution of measured cell voltage in an example storage device. The table in FIG. 6B illustrates the adjustment that takes place in the various states in one example embodiment. For example, in state 1, thresholds 1, 2 and 3 are all taking a step in the minus direction. In state 14, thresholds 1, 2 and 3 are all taking a step in the plus direction. In one embodiment, the "next" state that is chosen in block 508 is based on the progression shown in a table such as that in FIG. 6B. In this manner, the threshold values are systematically adjusted until data is recovered or the time limit has been reached.

CONCLUSION

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, those skilled in the art will appreciate that in various embodiments, the actual steps taken in the processes shown in FIGS. 3, 4, and 5 may differ from those shown in the figures. Depending on the embodiment, certain of the steps described in the example above may be removed, others may be added, and the sequence of steps may be altered and/or performed in parallel. Although this disclosure describes examples in which data are stored in groups of blocks termed superblocks, those skilled in the art will recognize that the various embodiments disclosed are applicable to systems with other memory measurement units such as planes, blocks, pages, sectors, etc. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. In a data storage device comprising a non-volatile memory array, a method for selecting reference voltage values for performing memory read operations, the method comprising:
in response to a failed attempt to read data from a first storage element of the non-volatile memory array:
determining a set of one or more reference voltage values for reading data from the first storage element based at least in part on one or more reference voltage values associated with at least one other storage element in the non-volatile memory array; and
attempting to read the data from the first storage element using the determined set of one or more reference voltage values.

2. The method of claim 1, wherein the at least one other storage element is related to the first storage element.

3. The method of claim 2, wherein the at least one related storage element comprises a storage element in a common memory cell as the first storage element, and wherein the determined set of one or more reference voltage values comprises one or more reference voltage values used to successfully retrieve data from the at least one related storage element.

4. The method of claim 2, wherein the at least one related storage element comprises a storage element in a memory cell adjacent to a memory cell of the first storage element, and wherein the determined set of one or more reference voltage values comprises one or more reference voltage values used to successfully retrieve data from the at least one related storage element.

5. The method of claim 2, wherein the at least one related storage element comprises:
(1) a second storage element in a memory cell adjacent to a memory cell of the first storage element; and
(2) a third storage element in a common memory cell as the second storage element,
wherein the determined set of one or more reference voltage values is based on a combination of:
one or more reference voltage values used to successfully retrieve data from the second storage element; and
one or more reference voltage values used to successfully retrieve data from the third storage element.

6. The method of claim 1, further comprising:
in response to determining that the attempt to read the data from the first storage element using the determined set of one or more reference voltage values failed:
determining a revised set of one or more reference voltage values based on one or more reference voltage values of at least one another storage element; and
attempting to retrieve data from the first storage element using the revised set of one or more reference voltage values.

7. The method of claim 6, wherein the at least one other storage element comprises a storage element in a common memory cell as the first storage element and the at least one another related storage element comprises a storage element in a memory cell adjacent to a memory cell of the first storage element.

8. The method of claim 1, further comprising:
in response to determining that the attempt to read the data from the first storage element using the determined set of one or more reference voltage values failed:
adjusting one or more reference voltage values; and
attempting an additional read operation with the one or more adjusted reference voltage values;
in response to determining that the additional read operation successfully retrieves data from the first storage element, returning the retrieved data; and
in response to determining that the additional read operation does not successfully retrieve data from the first storage element:
determining whether a time limit has been reached;
in response to determining that the time limit has not been reached, repeating adjusting the one or more reference voltage values and attempting the additional read operation with the one or more adjusted reference voltage values; and
in response to determining that the time limit has been reached, returning a failure status.

9. The method of claim 8, wherein each successive repetition of the adjusting adjusts the one or more reference voltage values in accordance with a succession of adjustment.

10. The method of claim 1, further comprising:
in response to determining that the attempt to read the data from the first storage element using the determined set of one or more reference voltage values failed:
looking up in a table one or more adjusted reference voltage values; and
attempting an additional read operation with the one or more adjusted reference voltage values.

11. The method of claim 1, wherein determining the set of one or more reference voltage values comprises:
reading the at least one other storage element with an initial set of one or more reference voltage values with an error correction mechanism that returns an indication reflecting an amount of error encountered in the read operation on a second storage element; and
adjusting at least one value within the initial set of one or more reference voltage values based at least in part on the returned indication.

12. The method of claim 11, further comprising determining the set of one or more reference voltage values with a returned indication reflecting a minimal amount of error by repeating reading the at least one other storage element and adjusting the at least one value.

13. The method of claim 11, wherein the error correction mechanism is error correction code (ECC) and adjusting the at least one value is based on a number of bits with error encountered in reading the at least one other storage element.

14. The method of claim 1, wherein the failure is due to an uncorrectable ECC error.

15. The method of claim 1, wherein each of the first and the at least one other storage elements is a page.

16. A data storage device comprising:
a non-volatile memory array comprising solid state memory devices capable of being read using reference voltage values; and
a controller configured to read data from the non-volatile memory array, the controller further configured to respond to a failure in an attempt to read data from a first storage element of the non-volatile memory array by at least:
determining a set of one or more reference voltage values for reading data from the first storage element based at least in part on one or more reference voltage values associated with at least one other storage element in the non-volatile memory array; and
attempting to read the data from the first storage element using the determined set of one or more reference voltage values.

17. The device of claim 16, wherein the at least one other storage element is related to the first storage element.

18. The device of claim 17, wherein the at least one related storage element comprises a storage element in a common memory cell as the first storage element, and wherein the determined set of one or more reference voltage values comprises one or more reference voltage values used to successfully retrieve data from the at least one related storage element.

19. The device of claim 17, wherein the at least one related storage element comprises a storage element in a memory cell adjacent to a memory cell of the first storage element, and wherein the determined set of one or more reference voltage values comprises one or more reference voltage values used to successfully retrieve data from the at least one related storage element.

20. The device of claim 17, wherein the at least one related storage element comprises:
  (1) a second storage element in a memory cell adjacent to a memory cell of the first storage element; and
  (2) a third storage element in a common memory cell as the second storage element,
  wherein the determined set of one or more reference voltage values is based on a combination of:
    one or more reference voltage values used to successfully retrieve data from the second storage element; and
    one or more reference voltage values used to successfully retrieve data from the third storage element.

21. The device of claim 16, wherein the controller is further configured to:
  in response to determining that the attempt to read the data from the first storage element using the determined set of one or more reference voltage values failed:
    determine a revised set of one or more reference voltage values based on one or more reference voltage values of at least one another storage element; and
    attempt to retrieve data from the first storage element using the revised set of one or more reference voltage values.

22. The device of claim 21, wherein the at least one related storage element comprises a storage element in a common memory cell as the first storage element and the at least one other related storage element comprises a storage element in a memory cell adjacent to a memory cell of the first storage element.

23. The device of claim 16, wherein the controller is further configured to in response to determining that the attempt to read the data from the first storage element using the determined set of one or more reference voltage values failed:
  adjust one or more reference voltage values;
  attempt an additional read operation with the adjusted one or more reference voltage values;
  in response to determining that the additional read operation successfully retrieves data from the first storage element, return the retrieved data; and
  in response to determining that the additional read operation does not successfully retrieve data from the first storage element:
    determine whether a time limit has been reached;
    in response to determining that the time limit has not been reached, repeat adjusting the one or more reference voltage values and attempting the additional read operation with the adjusted one or more reference voltage values; and
    in response to determining that the time limit has been reached, return a failure status.

24. The device of claim 23, wherein the controller is further configured to perform each successive repetition of adjusting by adjusting the one or more reference voltage values in accordance with a succession of adjustment.

25. The device of claim 16, wherein the controller is further configured to in response to determining that the attempt to read the data from the first storage element using the determined set of one or more reference voltage values failed:
  look up in a table one or more adjusted reference voltage values; and
  attempt an additional read operation with the one or more adjusted reference voltage values.

26. The device of claim 16, wherein the controller is configured to determine the set of one or more reference voltage values by at least:
  reading the at least one other storage element with an initial set of one or more reference voltage values with an error correction mechanism that returns an indication reflecting an amount of error encountered in the read operation on a second storage element; and
  adjusting at least one value within the initial set of one or more reference voltage values based at least in part on the returned indication.

27. The device of claim 26, wherein the controller is further configured to determine the set of one or more reference voltage values with a returned indication reflecting a minimal amount of error by repeating reading the at least one related storage element and adjusting the at least one value.

28. The device of claim 26, wherein the error correction mechanism is error correction code (ECC) and adjusting the at least one value is based on a number of bits with error encountered in reading the at least one other storage element.

29. The device of claim 16, wherein the failure is due to an uncorrectable ECC error.

30. The device of claim 16, wherein each of the first and the at least one other storage elements is a page.

31. The device of claim 16, wherein the solid state memory devices comprise multi-level cell (MLC) devices.

32. A data storage device comprising:
  a non-volatile memory array comprising a plurality of storage elements; and
  a controller configured to read data from the non-volatile memory array, the controller further configured to respond to a failure in an attempt to read data from a first storage element of the non-volatile memory array using a set of one or more reference voltage values by at least:
    adjusting the one or more reference voltage values in the set;
    performing an additional read operation with the adjusted one or more reference voltage values;
    in response to determining that the additional read operation successfully retrieves data from the first storage element, returning the retrieved data; and
    in response to determining that the additional read operation does not successfully retrieve data from the first storage element:
      determining whether a time limit has been reached;
      in response to determining that the time limit has not been reached, repeating adjusting the one or more reference voltage values and performing the additional read operation; and
      in response to determining that the time limit has been reached, returning a failure status.

33. The device of claim 32, wherein the controller is configured to adjust the one or more reference voltage values based at least in part on a number of ECC error bits encountered during performing a prior unsuccessful read operation.

* * * * *